/ United States Patent / Kratochvil et al.

(10) Patent No.: US 12,132,443 B2
(45) Date of Patent: Oct. 29, 2024

(54) METHOD AND CIRCUIT ARRANGEMENT FOR DETECTING AN ARC AND PHOTOVOLTAIC (PV) INVERTER HAVING A CORRESPONDING CIRCUIT ARRANGEMENT

(71) Applicant: SMA Solar Technology AG, Niestetal (DE)

(72) Inventors: Marcel Kratochvil, Kassel (DE); Rainer Schmitt, Huenfeld (DE); Torsten Otto, Ahnatal (DE); Sybille Pape, Vellmar (DE)

(73) Assignee: SMA Solar Technology AG, Niestetal (DE)

( * ) Notice: Subject to any disclaimer, the term of this patent is extended or adjusted under 35 U.S.C. 154(b) by 231 days.

(21) Appl. No.: 17/865,606

(22) Filed: Jul. 15, 2022

(65) Prior Publication Data

US 2022/0360214 A1    Nov. 10, 2022

Related U.S. Application Data

(63) Continuation of application No. PCT/EP2021/050877, filed on Jan. 15, 2021.

(30) Foreign Application Priority Data

Jan. 15, 2020   (DE) ................. 10 2020 100 838.4

(51) Int. Cl.
  *G01R 31/66*   (2020.01)
  *H02J 3/14*   (2006.01)
  (Continued)

(52) U.S. Cl.
  CPC ............. *H02S 50/00* (2013.01); *G01R 31/66* (2020.01); *H02J 3/14* (2013.01); *H02J 3/381* (2013.01);
  (Continued)

(58) Field of Classification Search
  CPC .......... H02S 50/00; H02S 40/32; H02S 40/36; G01R 31/66; H02J 3/14; H02J 3/381; H02J 2300/24
  See application file for complete search history.

(56) References Cited

U.S. PATENT DOCUMENTS

2012/0134058 A1 * 5/2012 Pamer ................ H02S 50/10
                                                  702/58
2013/0335861 A1   12/2013 Laschinski et al.
(Continued)

FOREIGN PATENT DOCUMENTS

DE        10225259 B3 * 1/2004   ........ H01R 13/7038
WO     2011017721 A1     2/2011
(Continued)

OTHER PUBLICATIONS

International Search Report dated Apr. 12, 2021 in connection with PCT/EP2021/050877.

*Primary Examiner* — Jermele M Hollington
*Assistant Examiner* — Taqi R Nasir
(74) *Attorney, Agent, or Firm* — Eschweiler & Potashnik, LLC

(57) ABSTRACT

The disclosure describes a method for detecting an arc in a direct-current (DC) circuit comprising a DC load, a DC source supplying the DC load, and a circuit arrangement arranged between the DC source and the DC load. A power flow P between an input and an output of the circuit arrangement is suppressed by means of a switching circuit through cyclical interruption such that the power flow P is enabled in an active time window with the first period $\Delta t_1$ and the power flow P is suppressed in an inactive time window with the second period $\Delta t_2$. Via detection of an input current $I_{in}$ flowing at the input and/or an input voltage $U_{in}$ applied to the input and comparison of values of the input current $I_{in}$ and/or input voltage $U_{in}$ detected in the inactive (Continued)

time window with a current threshold value $I_{TH}$ or a voltage threshold value $U_{TH}$ an arc presence criterion is signaled if the input current $I_{in}$ detected in the inactive time window falls below the current threshold value $I_{TH}$ and/or the input voltage $U_{in}$ detected in the inactive time window does not exceed the voltage threshold value $U_{TH}$. The application also describes a circuit arrangement for detecting an arc and a photovoltaic (PV) inverter including such a circuit arrangement.

20 Claims, 5 Drawing Sheets

(51) Int. Cl.
*H02J 3/38* (2006.01)
*H02S 40/32* (2014.01)
*H02S 40/36* (2014.01)
*H02S 50/00* (2014.01)

(52) U.S. Cl.
CPC .............. *H02S 40/32* (2014.12); *H02S 40/36* (2014.12); *H02J 2300/24* (2020.01)

(56) References Cited

U.S. PATENT DOCUMENTS

| | | |
|---|---|---|
| 2015/0077884 A1* | 3/2015 | Behrends ............. H02H 1/0015 361/5 |
| 2016/0041222 A1 | 2/2016 | Handy |
| 2016/0291073 A1 | 10/2016 | Handy et al. |

FOREIGN PATENT DOCUMENTS

| | | |
|---|---|---|
| WO | 2012116722 A1 | 9/2012 |
| WO | 2013171329 A1 | 11/2013 |

* cited by examiner

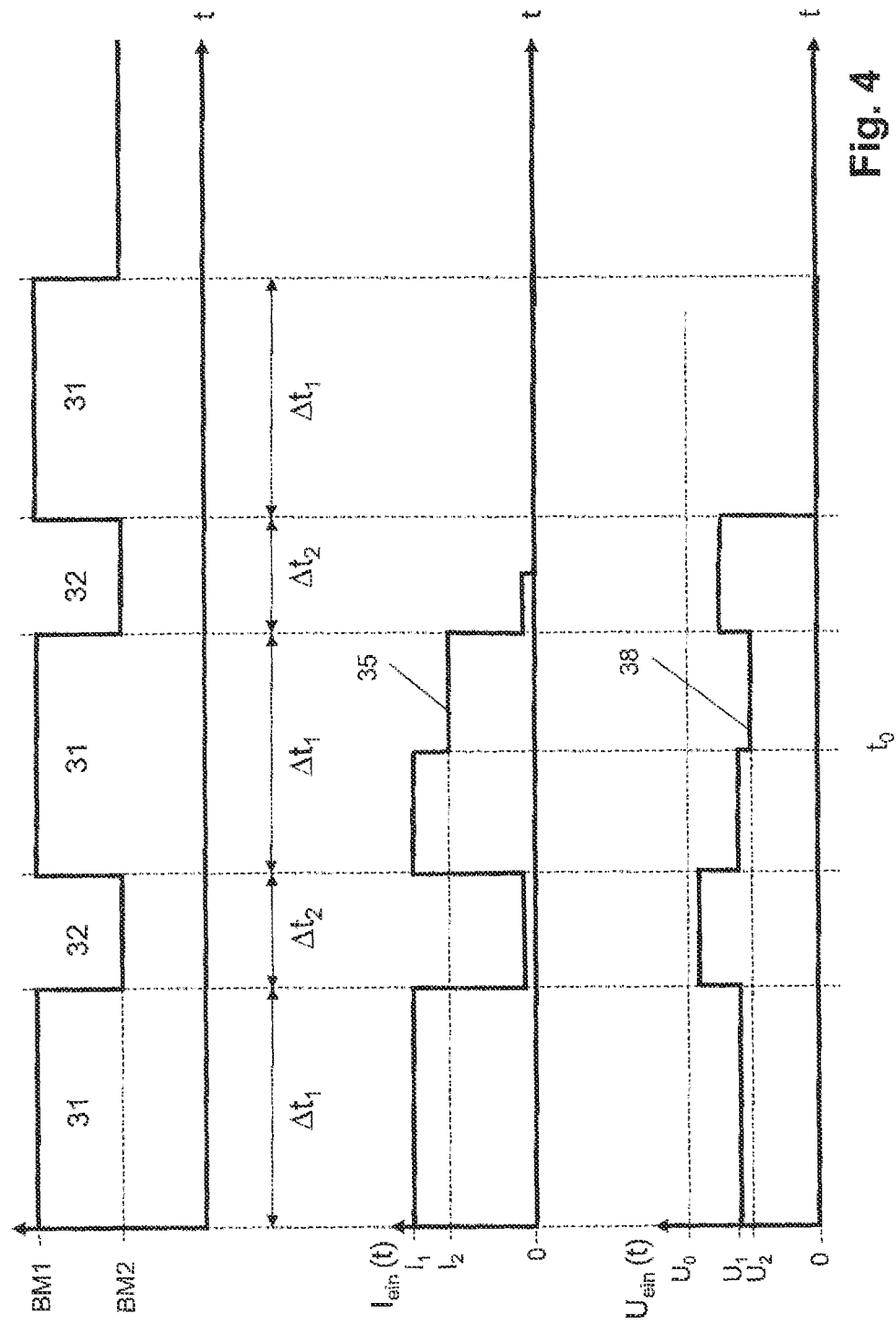

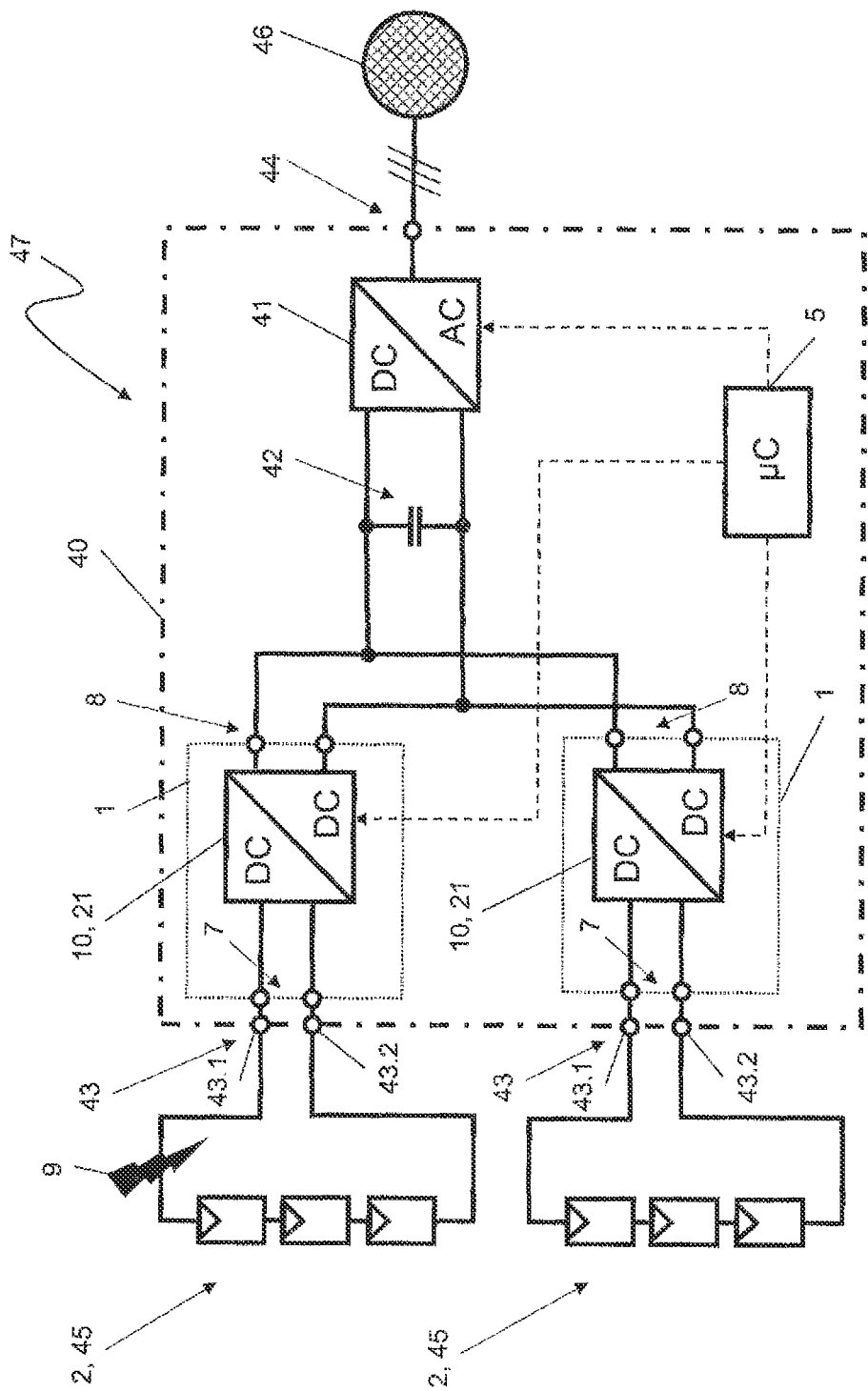

METHOD AND CIRCUIT ARRANGEMENT FOR DETECTING AN ARC AND PHOTOVOLTAIC (PV) INVERTER HAVING A CORRESPONDING CIRCUIT ARRANGEMENT

CROSS REFERENCE TO RELATED APPLICATIONS

This application is a continuation of International Patent Application Number PCT/EP2021/050877, filed on Jan. 15, 2021, which claims priority to German Patent Application number 10 2020 100 838.4, filed on Jan. 15, 2020, and is hereby incorporated by reference in its entirety.

FIELD

The disclosure relates to a method and a circuit arrangement for detecting an arc, and to a photovoltaic (PV) inverter comprising such a circuit arrangement.

BACKGROUND

Arcs can cause considerable damage in electrical systems, which can lead, for example, to a fire in the electrical system as well as in a building containing the system. Personal injuries are also possible. For this reason, arc detection is an important requirement in electrical systems. This is especially true if the electrical systems have a direct-current (DC) circuit because, in a DC circuit, unlike an alternating-current (AC) circuit, there is not usually a zero crossing of an electrical voltage that can extinguish a burning arc, or at least facilitate the quenching of the arc.

A distinction is usually made between two different types of arcs. A series arc occurs when there are contact faults, for example, when cables or plugs come loose but the contacts are so close that there is a locally high electrical field strength in an intermediate space between the contacts. An example of a series arc is also a switching arc that occurs between contacts of a relay during a switching operation. Parallel arcs are more rare and occur, for example, when the positive and negative lines of an electrical system are run close together and the insulation thereof becomes faulty. Here, too, a locally high field strength can exist between the damaged conductors. A power loss converted in a series arc is usually significantly lower than the power loss converted in a parallel arc. Therefore, a series arc between a power source and a load supplied by the power source causes a relatively small change in the transmitted power. In contrast thereto, a parallel arc results in a large change in the electrical power supplied by the power source and ultimately consumed by the load.

A conventional method for detecting an arc uses a noise spectrum that is usually emitted by the arc. When there is an arc in an electrical system, a high-frequency interference voltage or high-frequency interference current is superimposed on a useful electrical voltage or useful electric current. The high-frequency interference voltage and/or the high-frequency interference current can be electrically filtered and detected on the electrical conductors that also carry the useful current or the useful voltage. If a certain interference voltage and/or a certain interference current is exceeded, an arc is signaled. Such a method is described, for example, in WO 2012/116 722 A1. In order to increase the sensitivity of the detection, simultaneous detection of a number of different frequencies within the transmitted noise spectrum is also possible.

Another known method for detecting an arc uses a sudden change in an electrical voltage and/or an electric current that accompanies the formation of the arc. In this case, a current and/or a voltage is usually monitored with a high time resolution for the detection of a sudden change. The method can also be used, where necessary, to check the extent to which an observed change in the current and/or the voltage differs from normal fluctuations in the power consumption of the electrical load. An arc is signaled when the observed change in current and/or voltage differs significantly from the usual consumption fluctuations of the system. Such a method is disclosed, for example, in WO 2011/017721 A1.

Finally, WO 2013/171329 A1 discloses a method for arc detection that combines the detection of a noise signal with the detection of a sudden change in current. It is possible here to provide the temporal occurrence of the detected noise signal as well as the temporal occurrence of the detected current change in each case with a time stamp. An additional plausibility check for the existence of an arc can be ascertained by comparing both time stamps.

All methods usually use relatively complex and therefore costly measuring systems which become more complex the more reliably a possibly existing arc is detected or the more reliably false signaling of an arc and associated deactivation of the electrical system is to be avoided.

Document DE 102 25 259 B3 discloses an electrical plug connector comprising a main contact that leads during an unplugging process and a lagging auxiliary contact that is connected in parallel therewith. When the connector is unplugged, the main contact is inevitably separated first and the auxiliary contact last from its mating part. In order to avoid an arc associated with an unplugging process, a semiconductor switch connected in series with the auxiliary contact is switched on and off periodically between a contact separation of the main contact and the auxiliary contact.

SUMMARY

The disclosure is based on the object of specifying a method for detecting an arc, in particular a series arc, in a DC circuit that can be carried out comparatively inexpensively. In particular, complex detection systems are intended to be avoided here as far as possible and instead a relatively simple and inexpensive measuring technique is intended to be used. It is also an object of the disclosure to specify a circuit arrangement that is suitable for carrying out the method, as well as a photovoltaic (PV) inverter comprising such a circuit arrangement.

The method according to one embodiment of the disclosure aims to detect an arc in a direct-current (DC) circuit comprising a DC load, a DC source supplying the DC load, and a circuit arrangement arranged between the DC source and the DC load. In this case, the circuit arrangement comprises an input comprising two input terminals for connecting the DC source, an output comprising two output terminals for connecting the DC load, and a switching circuit arranged between the input and the output and comprises an input capacitance between the input terminals at the input. The switching circuit has at least two operating modes and can be operated in these modes. Specifically, the switching circuit is configured to enable a power flow P between the DC source and the output of the circuit arrangement in a first operating mode and to suppress the power flow between the DC source and the output of the circuit arrangement in a second operating mode. The method comprises cyclical interruption of the power flow P between the input and the output of the circuit arrangement by means of the switching circuit such that the power flow P is enabled in an active time window with the first period $\Delta t_1$, wherein P≠0, and the power flow P is suppressed in an inactive time window with the second period $\Delta t_2$, wherein P=0. The method further comprises detection of an input current $I_{in}$ flowing at the input and/or an input voltage $U_{in}$ applied to the input, comparison of values of the input current $I_{in}$ and/or input voltage $U_{in}$ detected in the inactive time window with a current threshold value $I_{TH}$ or a voltage threshold value $U_{TH}$, and signaling of an arc presence criterion if the input current $I_{in}$ detected in the inactive time window falls below the current threshold value $I_{TH}$ and/or the input voltage $U_{in}$ detected in the inactive time window does not exceed the voltage threshold value $U_{TH}$.

The input current $I_{in}$ flowing at the input is a current that flows from the DC source into the circuit arrangement via one of the input terminals or flows out of the circuit arrangement again via the other of the input terminals. During an active time window, the input current $I_{in}$ represents a current characterizing the power flow P between the input and the output of the circuit arrangement. In contrast, during an inactive time window, the power flow P between the DC source and the output of the circuit arrangement is interrupted by means of the switching circuit. In this case, the input current $I_{in}$ flows only between the DC source and the input capacitance.

The input voltage $U_{in}$ applied to the input is applied between the two input terminals. Since the input capacitance is also arranged between the input terminals, the input voltage $U_{in}$ also corresponds at the same time to the voltage at the input capacitance.

The signaling of an arc presence criterion indicates that a criterion from which it can be concluded that an arc is present has been recognized.

The arc to be detected may be, for example, a series arc. The circuit arrangement can be wholly or partly part of an electrical device, such as an energy conversion device, for example, an inverter. The DC load can be embodied as a DC load in the conventional sense and for this purpose contain only DC consumers. However, it can also comprise a DC-AC converter that is connected to an AC voltage (AC) load on the output side. The AC load can be an electrical device that is supplied by an AC voltage. As an alternative to this, however, the AC load may also be an energy supply grid into which the DC-AC converter feeds AC power converted from DC power. A cyclical interruption of the power flow P means a repeated interruption of the power flow P that satisfies a rule, which may take place periodically, but does not have to take place periodically. If an interruption occurs periodically, a sum of the first period $\Delta t_1$ and the second period $\Delta t_2$ is constant, that is to say $\Delta t_1 + \Delta t_2$=const, while the sum is not constant in the case of an aperiodic interruption. The power flow P can be interrupted periodically if a power fluctuation in the consumption of the DC load can be rated as negligibly small. If this cannot be assumed, the cyclical interruption of the power flow usually takes place aperiodically.

The disclosure uses the effect that a power flow P that usually occurs continuously in the DC circuit between the DC source and the DC load is converted by the switching circuit to a power flow P that occurs discontinuously. This applies at least to a first area of the DC circuit that is arranged between the DC source and the output of the circuit arrangement. Here, it is possible, but not absolutely necessary, in one embodiment for the power flow P to be interrupted everywhere in the first area of the DC circuit—that is to say over the entire route between the DC source and the output of the switching arrangement. Instead, it is sufficient if the cyclical interruption of the power flow takes place only on a subsection between the DC source and the output of the circuit arrangement. In specific terms, for example, if the power flow is interrupted only on a subsection between the DC source and the output, charging processes, which are still decaying, of capacities present there can take place in the remaining subsection of the first area of the DC circuit. However, by suppressing the power flow on a subsection of the first area of the DC circuit, the power flow on the remaining subsection within the first area of the DC circuit is at least substantially reduced in response. In a second area of the DC circuit that is arranged between the output of the circuit arrangement and the DC load, the power flow can be either discontinuous or continuous.

Since there is no power flow from the DC source to the output of the circuit arrangement in the deactivated second time windows, a zero crossing of a current I is purposefully brought about in the DC circuit, but at least in the first area of the DC circuit, and there at least on a subsection of the first area of the DC circuit extending from the DC source to the output of the switching arrangement. In summary, it applies to the entire first area of the DC circuit between the DC source and the output of the circuit arrangement that the power flow P, if it is not completely interrupted everywhere, is at least largely reduced everywhere. At the same time, the energy is drawn from a series arc that may be present in the first area of the DC circuit. Due to the energy draw, the arc cannot continue to burn, but instead is quenched, at least temporarily within the inactive time window. If, in an active time window following the inactive time window, a power flow P again takes place from the DC source to the output of the circuit arrangement, the risk that this power flow P likewise accompanied by a burning arc, relative to the previous active time window in which the arc was still burning, is then significantly reduced. In other words: if an arc burned in the chronologically preceding one of the two active time windows, the arc is no longer present in the chronologically following one of the two active time windows with a high degree of probability. In this case, the probability increases as the second period of the inactive time window or the inactive time windows that lie between two active time windows increases.

In one embodiment, in the inactive time windows, the DC load can be supplied from an intermediate energy store that is already present at an input of the DC load, for example, a capacitance, or from an output capacitance that is additionally to be provided and connected in parallel with the output of the circuit arrangement. In addition, the second periods $\Delta t_2$ of the inactive time windows can be selected to be so small that the capacitance or the output capacitance discharges only insignificantly, such that an undersupply of the DC load and any potentially associated faulty operation of the DC load can be largely avoided.

In a further embodiment, a method according to the disclosure additionally comprises detection of a current I characterizing the power flow P and/or a voltage U characterizing the power flow P in two consecutive active time windows, comparing the detected values of current I and/or voltage U of the active time window with the corresponding detected values from the preceding active time window, and signaling of a further arc presence criterion if the values of current I and/or voltage U of the active time window differ from the corresponding values of the preceding active time window by more than a threshold value.

The current I to be detected and characterizing the power flow P may be a current flowing between the DC source and the input of the circuit arrangement. As an alternative to this, it may also be a current flowing between the input of the circuit arrangement and the switching circuit or a current flowing between the switching circuit and the output of the circuit arrangement. The detected voltage U may be a voltage applied to the input of the circuit arrangement, that is to say the input voltage $U_{in}$, and/or may be a voltage applied to the output of the circuit arrangement. It is within the scope of the disclosure to detect only one current, but alternatively also to detect a plurality of currents characterizing the power flow P between the DC source and the output. Alternatively or cumulatively to this, it is possible to detect only one voltage, but also to detect a plurality of voltages characterizing the power flow P between the DC source and the output of the circuit arrangement.

In the further embodiment of the method, which carries out an evaluation of voltages and currents in two consecutive active time windows, a respective current I and/or a voltage U are detected in each of the two time-offset active time windows, which are assigned to the power flow P in the respective active time window. Since a power loss consumed by an arc can also be assigned to the arc, the electrical variables of current I and/or voltage U change depending on the existence of the arc in the DC circuit. A comparison of the detected values of current I and/or voltage U of the two time-offset active time windows can therefore be used to determine whether or not one of the two active time windows has an arc in contrast to the other of the two active time windows. This applies, in particular, if the consumption of the DC load over time is known for other reasons and/or does not change over time, at least not significantly. Specifically, an arc presence criterion can therefore be signaled when the values of current I and/or voltage U of the chronologically following active time window differ from the corresponding values of current I and/or voltage of the preceding active time window by more than a predefined threshold value.

In the method according to the disclosure, no special requirements are to be made of a measuring device for detecting the electrical variables from current I and/or voltage U. The measuring device does not have to have high accuracy or high temporal resolution, that is to say a high measuring frequency, either. This is because it is not important to detect a sudden change in the electrical variables. Instead, it is sufficient, for example in the further embodiment of the method, to detect only one value of the electrical variables that is representative of the respective active time window, for example a mean value of the respective active time window. For this reason, the measuring device for detecting the electrical variables can be designed very cost-effectively. It is often already present in the DC circuit, which is why no additional costs are incurred in this case. Since, according to the disclosure, the power flow P in the DC circuit between the DC source and the output of the circuit arrangement occurs discontinuously, quasi in individual energy packets, even during normal operation of the DC load, a complex detection device for triggering an otherwise one-time interruption of a continuously occurring power flow is not required. Instead, the method according to the disclosure operates as if there were an arc, for example, a series arc, in each of the active time windows, at least in the first area of the DC circuit, which would have to be quenched by the interruption, caused by means of the switching circuit, of the power flow P coming from the DC source in the inactive time window. The information as to whether an arc was actually present in the preceding active time window only results from the detection of the electrical variables of the current I and/or voltage U in the inactive time window or in the chronologically following active time window and the comparison of these with threshold values or with the corresponding detected variables of the current I and/or voltage U of the chronologically preceding active time window.

In one embodiment of the method, the switching circuit can interrupt the power flow P between the DC source and the output of the circuit arrangement in response to a signaled arc presence criterion and/or a signaled further arc presence criterion permanently, but at least for a period that is long compared to the second period $\Delta t_2$ of the inactive time window. For example, such an interruption occurring in response to a signaled arc presence criterion and/or a signaled further arc presence criterion can last for several minutes or until it is manually acknowledged. In this way, a specialist can be given the opportunity to identify and repair any damage in the DC circuit caused by the detected arc.

The arc presence criteria are therefore taken into account alternatively or cumulatively for a decision as to whether an arc was present, the arc in this case inherently already having been quenched in the inactive window. In any case, the accuracy of the arc detection when considering multiple arc presence criteria is increased compared to the accuracy of the arc detection when considering only a single arc presence criterion. Depending on the choice of alternative or cumulative consideration, there is an improvement here in terms of preventing false positive or false negative detections. It is also possible to use the arc presence criterion ascertained by an evaluation in the inactive time window for improving the detection in the active time window, for example, by adjusting the threshold value for the evaluation in the active time window depending on the presence of the arc presence criterion.

The active time window and the preceding active time window, whose values of the current I and/or voltage U are compared with one another, do not necessarily have to follow one another directly. Instead, they can be separated from one another by a number of inactive time windows and at least one further active time window. In an advantageous embodiment of the method, however, the active time window and the preceding active time window can also be separated from one another by exactly one inactive time window. In this way, a change in the consumption of the DC load that occurs in the meantime is less important when comparing the electrical variables.

In an advantageous embodiment of the method, a value of the second period $\Delta t_2$ of the inactive time window can be selected so that it is not only sufficiently high to quench an arc that may be present in the DC circuit but instead is also sufficiently high to suppress reignition of the previously quenched arc in an active time window that may chronologically follow the inactive time window. The value of the second period can depend, for example, on a thermal time constant associated with the arc and in this case can be greater than the corresponding thermal time constant. The thermal time constant describes a decrease over time in the electrical conductivity of the plasma arc column in the event that no more electrical energy is delivered to the arc, for example because the power flow in the first area of the DC circuit was interrupted by means of the switching circuit. Specifically, if, after an arc has been quenched, a time for the renewed application of an electrical voltage U to the arc column is greater than the thermal time constant, the arc cannot be reignited. In addition, a value of the minimum necessary interruption time of the current flow can also depend on the power converted in the burning arc. Therefore, a value of the second period $\Delta t_2$ of the inactive time window can also be selected depending on the detected values of a current I characterizing the power flow P and/or a voltage U characterizing the power flow P of the immediately preceding active time window. For example, the value of the second period $\Delta t_2$ can increase as the value of the detected current I and/or the detected voltage U from the preceding time window increases. Tests have shown that it is sufficient if the second period $\Delta t_2$ comprises a value between 0.1 ms and 10.0 ms, for example, a value between 0.3 ms and 4.0 ms.

The second period $\Delta t_2$ of the inactive time window can be determined depending on the values of the input current $I_{in}$ detected in the inactive time window and/or on the values of the input voltage $U_{in}$ detected in the inactive time window. Specifically, the second period $\Delta t_2$ of the inactive time window can, for example, be limited in that the detected input current $I_{in}$ falls below a further current threshold value $I_{TH2}$ and/or the detected input voltage $U_{in}$ exceeds another voltage threshold value $U_{TH2}$. In this case, the further current threshold value $I_{TH2}$ is selected, in particular selected to be so low, that a series arc, if it should be present between the DC source and the input of the circuit arrangement, cannot continue to burn. Thus, with the current falling below the further current threshold value $I_{TH2}$, it is ensured that any series arc that may exist between the DC source and the input is safely quenched.

It goes without saying that the input current $I_{in}$ can be detected by means of a corresponding current sensor. However, this requires an additional current sensor in addition to a voltage sensor that is often present anyway. In the inactive time window, however, the input current $I_{in}$ flowing between the DC source and the input, in particular the input capacitance, can also be measured by means of a change over time in the input voltage $U_{in}$ applied to the input capacitance. Specifically, the time derivative of the input voltage $U_{in}$ dropping across the input capacitance provides here a measure of the input current flowing between the DC source and the input of the circuit arrangement. In this way, it is possible with just one voltage sensor to determine both the input voltage $U_{in}$ as well as the input current.

In a further embodiment of the method, the switching circuit of the circuit arrangement comprises a DC-DC converter, for example, a step-up converter. In addition, the circuit arrangement in this embodiment has an output capacitance connected in parallel with the output thereof. In one embodiment, in the active time window, an output voltage $U_{out}$ applied to the output capacitance can be increased toward an end of the first period $\Delta t_1$ by the switching circuit. For example, when at least 50%, or at least 75%, or at least 90%. of the first period $\Delta t_1$ of the active time window is reached or exceeded, the output voltage $U_{out}$ applied to the output capacitance can be increased. In doing so, the increase can be performed by at least 10%, preferably by at least 20%, of an output voltage $U_{out}$ applied at the output capacitance at the beginning of the active time window. In any case, with a DC-DC converter comprising a freewheeling diode, the output voltage $U_{out}$ applied to the output capacitance should at least equal or exceed the open circuit voltage of the DC source. This is the only way to ensure that the switching circuit in connection with the output voltage $U_{out}$ applied on the output side suppresses the power flow between the input and the output of the circuit arrangement. In addition, in this way, energy that is intermediately stored in the output capacitance and from which the DC load is also supplied in particular in the immediately adjacent inactive time window can be increased. An upper limit for the second period $\Delta t_2$ for the immediately adjacent inactive time window can be increased and a risk of an incorrect supply of the DC load, in particular during the inactive time window, can be avoided, or at least reduced. In contrast, the losses of the DC-DC converter that occur for intermediate storage of the energy only occur at the end of the active time window, that is to say only during a fraction of the first period $\Delta t_1$, and not throughout the entire first time window. In addition, the components providing the output capacitance are loaded with high voltage values for only a fraction of the first period.

In one embodiment of the method, a value of the first period $\Delta t_1$ of the active time window can be selected in such a way that an arc energy that would be generated by a power loss of an assumed arc in the active time window does not exceed a predetermined maximum permitted energy value $E_{max}$. In this case, it is assumed that there is a fictitious arc in the currently active time window, but this arc does not necessarily exist in reality. However, based on the assumption of the fictitious arc burning in the active time window, the current I in the active time window and an assumed voltage drop $\Delta u_{LB}$ of the arc can be used to estimate the first period $\Delta t_1$ of the active time window according to $$\Delta t_1 = \frac{E_{max}}{\Delta U_{LB} * I}$$

Depending on the temporal resolution capability of the present measuring device, several detected values for the current I can also be used. In this case, in the denominator of the above equation for the current I, an average current $I_{average}$ can be used. For the voltage drop $\Delta u_{LB}$ of the arc, there are experimentally determined or experience-based values. For example, in conventional PV systems, a value between 30 V and 40 V can be used as a good approximation for the voltage drop of the arc.

With regards to detecting an arc in a DC circuit of a photovoltaic (PV) system, it is advantageous in one embodiment if the maximum possible energy value $E_{max}$ has a value of $E_{max}$=200 J, which is also listed in relevant standards. Specifically, if the amount of energy transported in the active time window does not exceed the value 200 J, in the event that an arc was actually detected in the preceding active time window, the PV system can be restarted in a simplified form and in particular without using an electrical specialist.

In one embodiment of the method, a plurality of DC sources can be connected to the DC load in parallel with one another via a circuit arrangement in each case in order to jointly supply the DC load with their respective power flows P. In doing so, the method for detecting an arc, for example, a series arc, can be carried out simultaneously for each of the DC sources, with the inactive time windows assigned to the respective cyclical interruption of the power flows P being arranged so as to be, in one embodiment, offset in time from one another when the method is carried out for the different DC sources and do not overlap if possible. The cyclical interruption of the power flows P is advantageously carried out in such a way that at least a time overlap between the inactive time windows of the different DC sources is minimized. In this way, robust operation of the DC load is ensured by minimizing a fluctuation in the total power flow, which results from a sum of the individual power flows P from the multiple DC sources.

A circuit arrangement according to the disclosure for detecting an arc in a DC circuit comprises an input comprising two input terminals for connecting a DC source and an output comprising two output terminals for connecting a DC load, an input capacitance between the input terminals, and a switching circuit arranged between the input and the output, wherein the switching circuit is configured to enable a power flow P between the input and the output in a first operating mode and to suppress a power flow P between the input and the output in a second operating mode. The circuit arrangement also comprises a measuring device for determining an input voltage $U_{in}$ applied to the input and/or an input current $I_{in}$ flowing at one of the input terminals, and a control circuit for controlling the switching circuit and optionally the measuring device.

The circuit arrangement is characterized in one embodiment that the control circuit is configured and set up in conjunction with the switching circuit and the measuring device to carry out the method according to the disclosure.

In order that the switching circuit is able to suppress the power flow P between the input and the output, it can have one or more controllable switches, in particular semiconductor switches. Alternatively or cumulatively, it is also possible for the switching circuit to have one or more non-controllable semiconductor switches, for example diodes, to suppress the power flow P. The control circuit can be designed as a separate control circuit. Alternatively, however, the control circuit can also be designed as a component of a control circuit that is already present in the DC circuit. This results in the advantages already explained in connection with the method.

In one embodiment of the circuit arrangement, the switching circuit can have a semiconductor switch arranged in one of the connection lines from one of the input terminals to one of the output terminals. The semiconductor switch can be free of an intrinsically formed freewheeling diode or a separately formed freewheeling diode connected in parallel with current-carrying terminals of the semiconductor switch. As an alternative to this, however, the semiconductor switch can also have a freewheeling diode connected in parallel with current-carrying terminals of the semiconductor switch. In this case, the freewheeling diode can be designed either as an intrinsic freewheeling diode or as a separately formed freewheeling diode. If the semiconductor switch has a freewheeling diode, it can be arranged in particular in such a way that it is reverse-biased with respect to a normal current direction of the DC circuit.

The circuit arrangement may comprise an intermediate energy store connected in parallel with the output, in particular an output capacitance. Using the output capacitance, the circuit arrangement is able to intermediately store a limited amount of energy from the DC source in the active time window, by means of which energy the DC load is supplied in the following inactive time window. In this way, it is possible to supply the DC load during the inactive time window even if the DC load does not include the possibility of intermediate storage. In this case, the power flow P is discontinuous only in the first area of the DC circuit, while it is continuous in the second area of the DC circuit. According to one embodiment, the circuit arrangement according to the disclosure or the switching circuit of the circuit arrangement can be designed as a DC-DC converter, in particular as a step-up converter. In this case, the power flow P from the DC source to the output of the circuit arrangement can be interrupted in that the circuit arrangement, in particular the switching circuit of the circuit arrangement, is deactivated and a voltage applied to the output of the circuit arrangement is greater than a voltage applied to the input of the circuit arrangement. Experiments show that deactivation over a few, advantageously a maximum of 8, switching cycles of the DC-DC converter is sufficient.

A photovoltaic (PV) inverter according to the disclosure comprises at least one input comprising two input terminals for connecting a PV string as a DC source and an output for connecting an AC voltage (AC) grid, a DC-AC converter for converting a DC voltage to an AC voltage, and a circuit arrangement according to the disclosure. In this case, the input of the circuit arrangement is connected to the at least one input of the PV inverter and the output of the circuit arrangement is connected to an input of the DC-AC converter. The inverter may be a single-phase PV inverter, which has a maximum of one phase conductor terminal and one neutral conductor terminal on the output side. Alternatively, it may also be a multiphase PV inverter comprising a plurality of phase terminals on the output side, in particular three phase terminals on the output side, and one neutral conductor terminal on the output side. The control circuit of the circuit arrangement can be integrated in a control circuit of the PV inverter, or in a superordinate control circuit of a PV system comprising the PV inverter. The advantages already mentioned in connection with the method and the circuit arrangement result.

If the method according to the disclosure for detecting an arc, for example, a series arc, is applied within a PV system, in which the DC source comprises a PV string and the DC load comprises a single-phase DC-AC converter connected on the output side to an AC voltage (AC) grid, it is advantageous if the cyclical interruption of the power flow P takes place in such a way that there is a zero crossing of an AC current $I_{AC}$ (t) flowing via an output of the DC-AC converter during the second period $\Delta t_2$ of the inactive time window. In the case of a single-phase DC-AC converter, power is namely drawn from an intermediate store of the PV inverter, for example, a link circuit capacitance of a DC link circuit, in a sinusoidally pulsed manner at a frequency that corresponds to twice the frequency of the AC grid connected to the PV inverter, wherein, in the vicinity of the zero crossings of the AC current $I_{AC}$ (t) generated by the DC-AC converter, the lowest power or energy is drawn from the intermediate store. If the inactive time windows now temporally overlap with the zero crossings of the AC current $I_{AC}$ (t), a voltage ripple of the DC link circuit can be minimized.

In one embodiment of the disclosure, the PV inverter can only have one single input to which a PV string is connected as a DC source. In a further embodiment of the disclosure, however, the PV inverter can also have a plurality of inputs that are each designed for connecting a respective PV string as a DC source. In this case, the inputs can each be connected in parallel with one another via a DC-DC converter to a common DC link circuit. The DC link circuit, which can include a link circuit capacitance, can in turn be connected to an input of the DC-AC converter. In this case, each of the inputs of the PV inverter can be assigned a circuit arrangement according to the disclosure, each of the inputs of the PV inverter being connected to the input of a circuit arrangement assigned thereto and the output of each of the circuit arrangements being connected to the input of the DC-AC converter each. It is within the scope of the disclosure if each of the circuit arrangements is formed at least partially, possibly also completely, by one of the DC-DC converters, respectively.

In one embodiment of the PV inverter, the control circuits of the circuit arrangements can be included in a superordinate control circuit of the PV inverter. In this case, at the same time, the superordinate control circuit is set up to control the DC-AC converter and the DC-DC converter of the PV inverter in such a way that, during operation of the PV inverter, a voltage applied to the DC link circuit is above a maximum value of the open circuit voltages of the individual PV strings.

Advantageous embodiments of the disclosure are specified in the following description of the figures and in the dependent claims, the features of which may be applied individually and in any combination with each other.

BRIEF DESCRIPTION OF THE FIGURES

In the following, the disclosure is illustrated using figures. In the figures

FIG. 4 shows time profiles for the operating mode, current and voltage of a circuit arrangement according to the disclosure during a further embodiment of the method according to the disclosure; and FIG. 5 shows a PV system comprising a PV inverter according to the disclosure in one embodiment.

DETAILED DESCRIPTION

Figure 1:
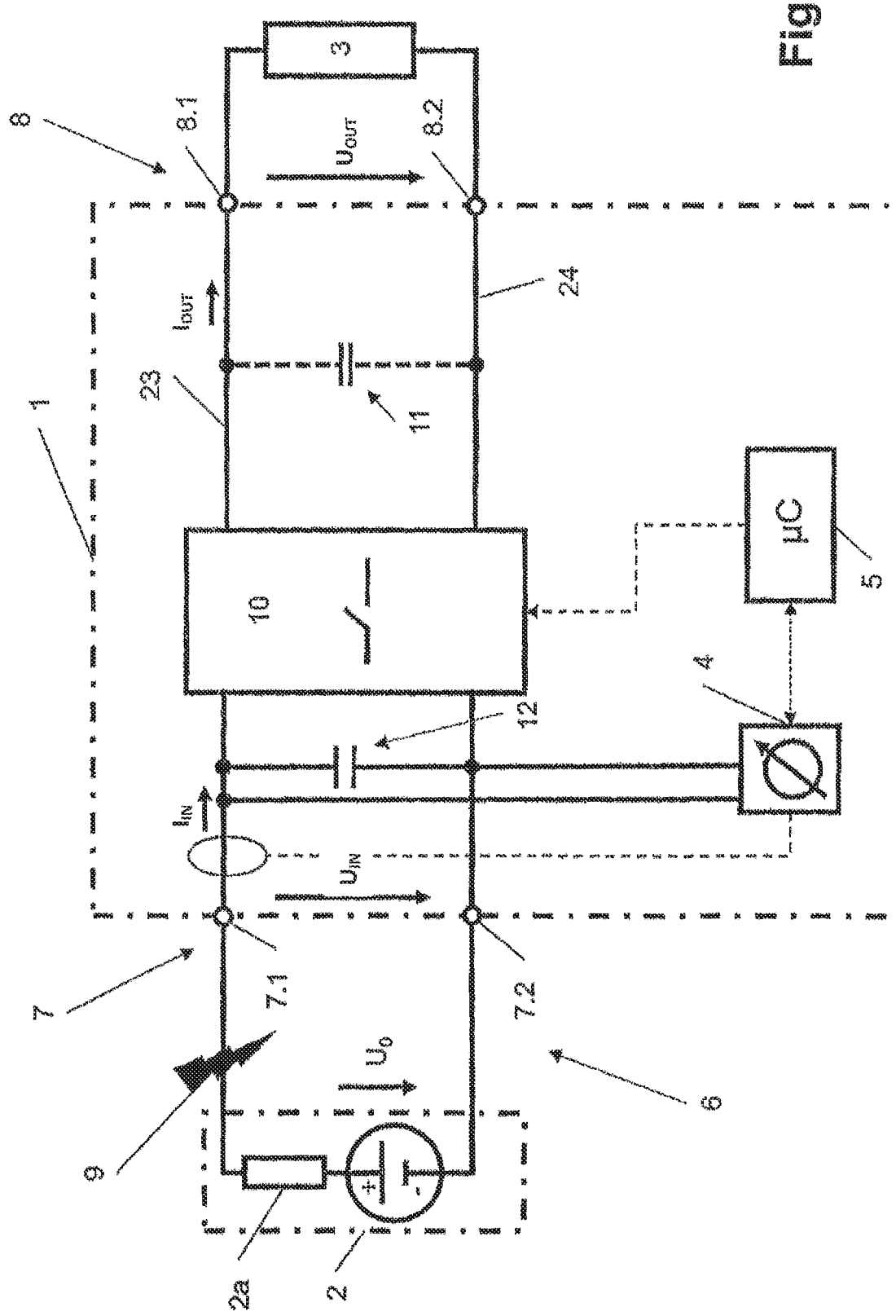
FIG. 1 shows a DC circuit comprising a DC source, a DC load, and a circuit arrangement according to the disclosure in a first embodiment.

FIG. 1 shows a direct-current (DC) circuit 6 comprising a DC source 2 which has an internal resistance 2a, a DC load 3 and a circuit arrangement 1 according to the disclosure in a first embodiment. The circuit arrangement 1 has an input 7 comprising a first input terminal 7.1 and a second input terminal 7.2, to which input the DC source 2 is connected. The circuit arrangement 1 also has an output 8 comprising a first output terminal 8.1 and a second output terminal 8.2, the output 8 being connected to the DC load 3. Each of the input terminals 7.1, 7.2 is connected via a respective connection line 23, 24 to a corresponding one of the output terminals 8.1, 8.2. A switching circuit 10 is arranged between the input 7 and the output 8. The switching circuit 10 is designed or otherwise configured to enable a power flow P between the DC source 2 and the output 8 during a first operating mode BM1 and to suppress it during a second operating mode BM2. For example, a power flow P between the input 7 and the output 8 can be made possible by means of the switching circuit 10 during the first operating mode BM1 and prevented during the second operating mode BM2. For this purpose, the switching circuit 10 comprises at least one controllable switch, possibly also a plurality of controllable switches. The switches may be electromechanical switches, or semiconductor switches. In addition, the switching circuit 10 can also comprise one or more non-controllable semiconductor switches, for example, diodes. The switching circuit 10 is controlled by a control circuit 5. The circuit arrangement 1 also comprises a measuring device 4 that is designed or otherwise configured to measure an input voltage $U_{in}$ applied to the input 7 of the circuit arrangement 1 and/or an input current $I_{in}$ flowing via an input 7. In addition, the measuring device 4 can also be configured to measure an output voltage $U_{out}$ applied to the output 8 and/or an output current $I_{out}$ flowing via the output 8. The measuring device 4 is connected to the control circuit 5 for the purpose of communication and control. The circuit arrangement 1 further comprises an input capacitance 12 that is connected in parallel with the input 7 between the input terminals 7.1 and 7.2. The circuit arrangement 1 can optionally additionally comprise an output capacitance 11—illustrated by dashed lines in FIG. 1—that is connected in parallel with the output 8 between the output terminals 8.1 and 8.2.

During operation of the circuit arrangement 1, a power flow P between the DC source 2 and the output 8 of the circuit arrangement 1 is interrupted cyclically by the switching circuit 10, that is to say in a manner satisfying a rule and repeatedly. A power flow P between the DC source 2 and the output 8 therefore takes place discontinuously, with—as explained below in connection with FIG. 4—active time windows 31 with a first period $\Delta t_1$ alternating with inactive time windows 32 with a second period $\Delta t_2$. During the active time window 31, a power flow P different from 0 thus takes place between the DC source 2 and the output 8, with the power flow P taking the value of 0 in the inactive time windows 32. The control circuit 5 is configured to selectively signal an arc presence criterion that indicates the presence of an arc 9, for example, a series arc.

Figure 2:
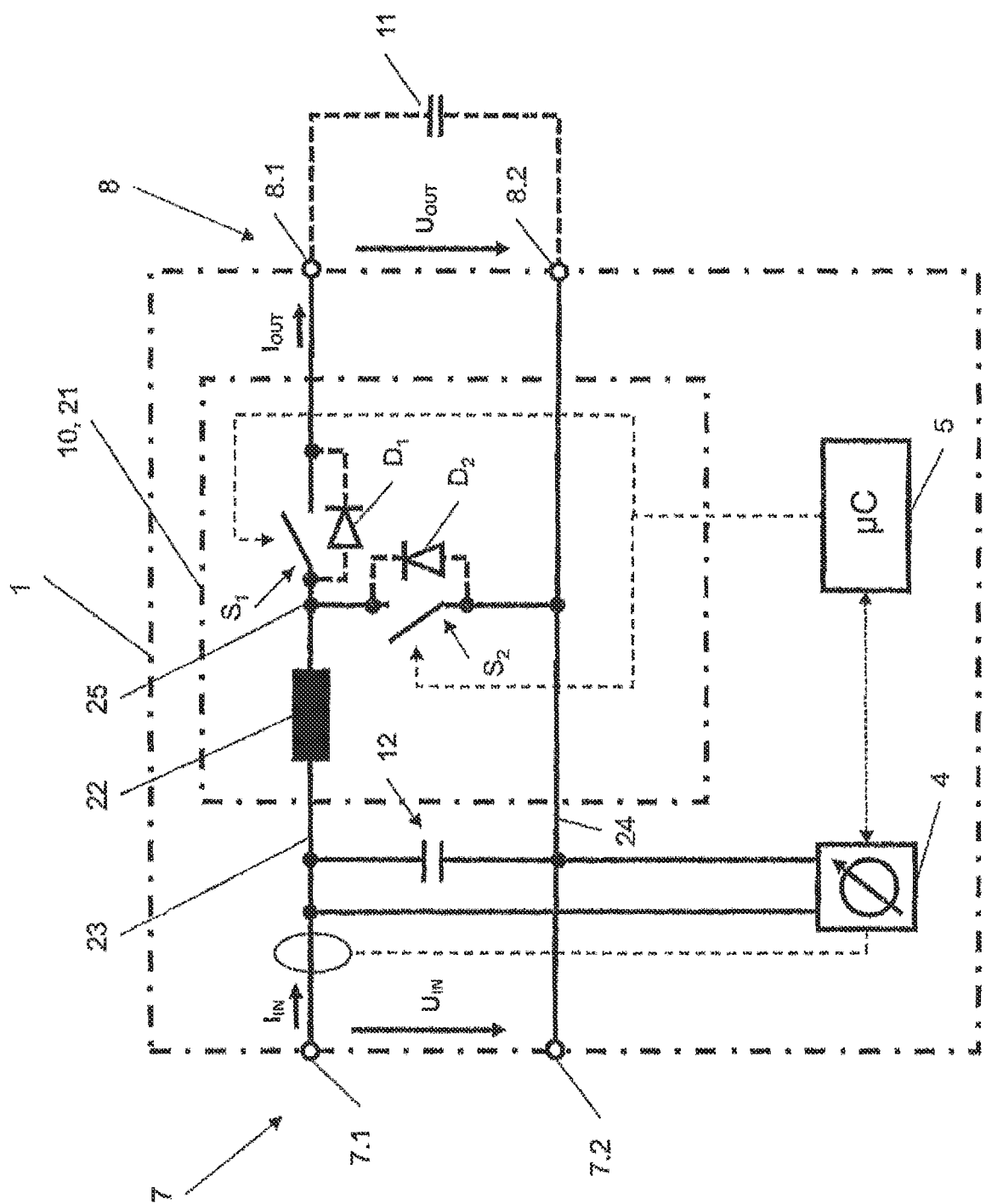
FIG. 2 shows a circuit arrangement according to the disclosure in a second embodiment.

FIG. 2 shows a circuit arrangement 1 according to the disclosure in a second embodiment. It is similar in some components to the first embodiment already described in FIG. 1, which is why reference is made to the descriptions under FIG. 1 for the matching features. Primarily the differences between the second embodiment and the first embodiment are explained below.

According to the second embodiment, the switching circuit 10 is configured as a DC-DC converter 21, for example, a step-up converter, to convert an input voltage $U_{in}$ applied to the input 7 to an output voltage $U_{out}$ applied to the output 8. For this purpose, the switching circuit 10 of the circuit arrangement 1 comprises an inductance 22 and a first semiconductor switch $S_1$ connected in series therewith within the first connection line 23 between the first input terminal 7.1 and the first output terminal 8.1. A second semiconductor switch $S_2$ is connected by way of its first terminal to a connection point 25 between the inductance 22 and the first semiconductor switch $S_1$ and connected by way of its second terminal to the second connection line 24. The first semiconductor switch $S_1$ and the second semiconductor switch $S_2$ may each comprise an intrinsic or separately formed freewheeling diode $D_1$ or $D_2$, illustrated using dashes in FIG. 2.

During the first operating mode BM1, in other words in the active time window 31 shown below in FIG. 3 or FIG. 4 with the first period $\Delta t_1$, the circuit arrangement 1 operates as a step-up converter and converts the input voltage $U_{in}$ to a larger output voltage $U_{out}$ relative to the input voltage $U_{in}$ by means of suitable clocking of the first $S_1$ and optionally the second semiconductor switch $S_2$. In this case, the output voltage $U_{out}$ is advantageously selected in such a way that it is greater than an open circuit voltage $U_0$ of a DC source 2 (not shown in FIG. 2) connected to the input 7. An energy associated with the output voltage $U_{out}$ is temporarily stored in an output capacitance 11 arranged in parallel with the output 8. In the second operating mode BM2, that is to say in the inactive time window 32 with the second period $\Delta t_2$, illustrated below in FIG. 3 and FIG. 4, the clocking of the semiconductor switches $S_1$, $S_2$ is interrupted by the control circuit 5. The semiconductor switches $S_1$, $S_2$ are both permanently open during the second operating mode BM2. The second period $\Delta t_2$ can last for a few clock cycles of the DC-DC converter 21. Since the voltage $U_{out}$ applied to the output 8 is now selected in such a way that it is greater than the open circuit voltage $U_0$ of the DC source 2 connected to the input, the freewheeling diode $D_1$, which may be present and associated with the first semiconductor switch $S_1$, blocks a current flow between the first input terminal 7.1 to the first output terminal 8.1, and thus a power flow P from the DC source 2 to the output 8 of the circuit arrangement 1.

Using the control circuit 5, the circuit arrangement 1 is set in an alternating manner during the first period $\Delta t_1$ to the first operating mode BM1 and during the second period $\Delta t_2$ to the second operating mode BM1, which generates a discontinuous power flow P from the DC source 2 to the output 8 of the circuit arrangement 1.

Figure 3:
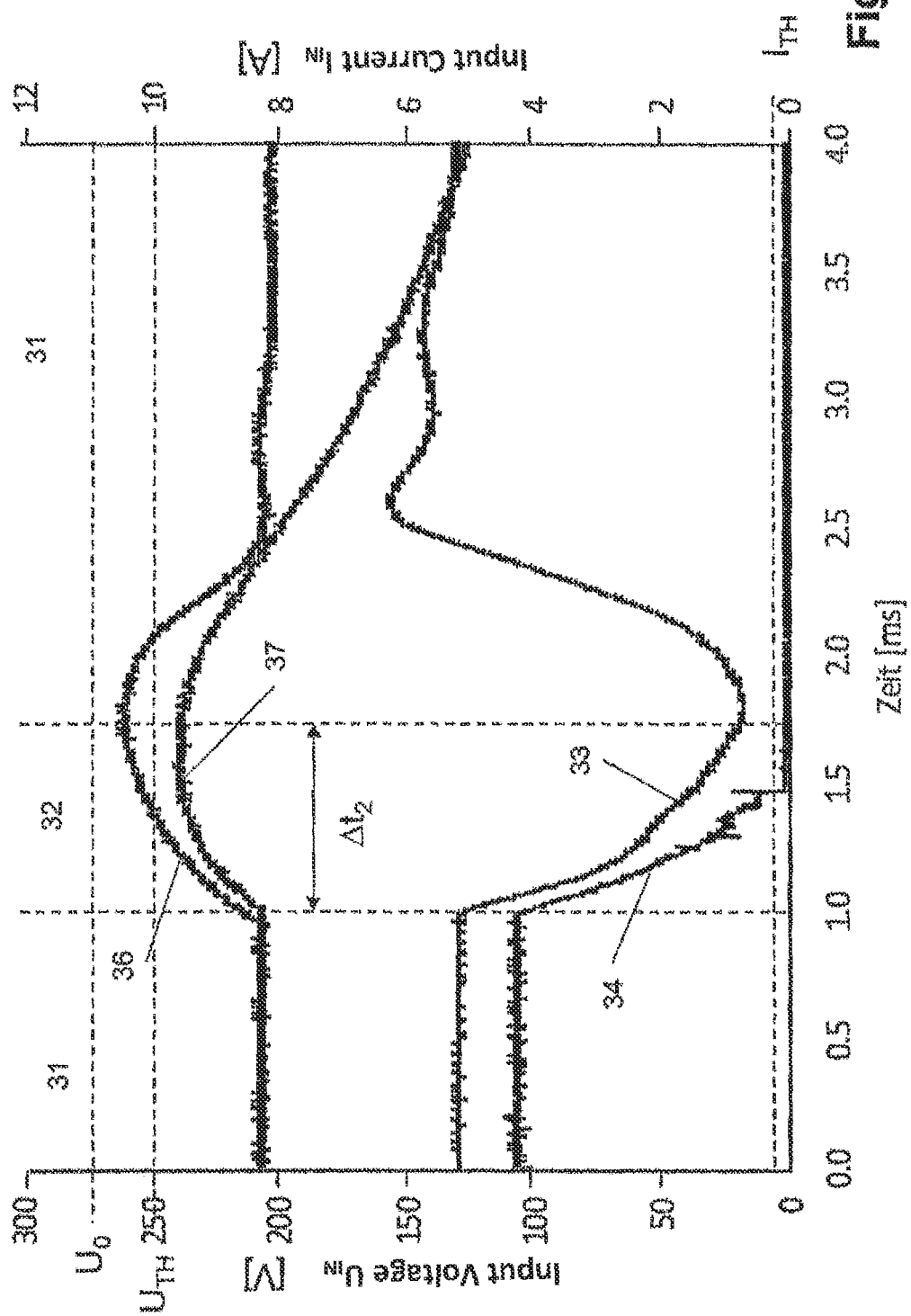
FIG. 3 shows time profiles for input current and input voltage of a circuit arrangement according to the disclosure during the method according to the disclosure.

In FIG. 3 input current profiles 33, 34 and input voltage profiles 36, 37 of a circuit arrangement 1 according to the disclosure are shown over time during the method according to one embodiment of the disclosure. According to the disclosure, the power flow P between the input 7 and the output 8 is interrupted cyclically by the switching circuit 10 of the circuit arrangement 1 according to the disclosure and there is thus a cyclical change between active time windows 31 and inactive time windows 32.

In the event that there is no arc 9, the result is the input current profile 33 shown and the input voltage profile 36 shown. First, during the first active time window 31, there is a power flow P between the input 7 and the output 8 and a constant input current $I_{in}$ associated therewith and a constant input voltage $U_{in}$ associated therewith. The value of the input voltage $U_{in}$ results in this case from the value of the open circuit voltage $U_0$ of the DC source 2 reduced by a voltage drop across the internal resistance 2a.

During the inactive time window 32, the power flow P between the input 7 and the output 8 is interrupted by the switching circuit 10 such that the input current $I_{in}$ can only flow from the DC source 2 to the input capacitance 12 in order to charge it. As a result of the current value decreasing in accordance with an e-function during this charging process, the voltage drop across the internal resistance 2a of the DC source 2 is also reduced accordingly so that the input voltage $U_{in}$ increases. With a correspondingly long period $\Delta t_2$ of the inactive time window 32, the input capacitance would be charged to the value of the open circuit voltage $U_0$ of the DC source 2, in which case the input current would then take a value of 0 A, with the result that no more voltage would drop across the internal resistance 2a of the DC source 2 and, accordingly, an input voltage $U_{in}$ at the level of the open circuit voltage $U_0$ of the DC source 2 would arise.

In the example shown in FIG. 3 of a method according to the disclosure for detecting an arc, the period $\Delta t_2$ of the inactive time window 32 is, however, only selected to be long enough for the input current $I_{in}$ to not become completely zero, but is only reduced to such an extent that an arc 9 that may be present is reliably quenched. The input voltage $U_{in}$ accordingly does not rise to a value of the open circuit voltage $U_0$ of the DC source 2, but to a lower value, as shown in FIG. 3.

Selecting a period $\Delta t_2$ as short as possible for the inactive time window 32 can be done, for example, also with regards to the fact that the period for the interruption of the power flow P between the input 7 and the output 8 present during the inactive time window 32 can be kept as short as possible.

After the period $\Delta t_2$ of the inactive time window 32, a power flow P between the input 7 and the output 8 is again made possible in the following next active time window 31 by the switching circuit 10, such that, as can be seen in FIG. 3, the input current $I_{in}$ increases again and the input voltage $U_{in}$ decreases again, in order to then take the constant values associated with the power flow P as in the first active time window 31 after the transient processes have ended.

The input current profile 34 for the case that an arc 9 is present also shows the falling profile that occurs in the course of the charging of the input capacitance 12 in the inactive time window 32, with the arc 9 then being quenched when the current value is sufficiently low and, as a result, the input current $I_{in}$ abruptly becoming zero and also remaining at a value of zero after a power flow P between the input 7 and the output 8 in the subsequent active time window 31 is made possible again by the switching circuit 10. As a result of the fact that, as described above, in the event that no arc 9 is present, in the method according to the disclosure the input current $I_{in}$ is not reduced to zero, the presence of an arc 9 can be detected and an arc presence criterion can be signaled by comparing the values of the input current $I_{in}$ with a current threshold $I_{TH}$.

The input voltage profile 37 in the event that an arc 9 is present also shows an increase in the inactive time window 32, but this is less of an increase than in the input voltage profile 36 in the event that no arc 9 is present. In particular, after the arc 9 has been quenched, based on the resulting value of the input current $I_{in}$ from 0 A, there is no further charging of the input capacitance 12. Due to the lower increase in the input voltage $U_{in}$ when an arc 9 is present than in the case that no arc 9 is present, in the inactive time window 32 the presence of an arc 9 can be detected and an arc presence criterion can be signaled by comparing the values of the input voltage $U_{in}$ with a voltage threshold $U_{TH}$. After a power flow P to the output 8 via the switching circuit 10 is again possible in the subsequent active time window 31, the input capacitance 12 is discharged via the switching circuit 10 through the DC load 3, such that the input voltage $U_{in}$ in the input voltage profile 37 falls to a value of zero with increasing time.

In one embodiment, fixed, empirically determined values can be used for the current threshold $I_{TH}$ and the voltage threshold $U_{TH}$. In one embodiment, however, the voltage threshold $U_{TH}$ can be selected in relation to the open circuit voltage $U_0$ of the DC source 2. Since the open circuit voltage $U_0$ of the DC source 2 may also be subject to greater fluctuations, for example, in a PV generator due to changes in external influences such as irradiation or temperature, in one embodiment a voltage threshold $U_{TH}$ that is variable, possibly adjusted adaptively depending on, for example, a time-varying open circuit voltage $U_0(t)$, can be used.

The deviating values of the input currents $I_{in}$ in the input current profiles 34 and 35 in the first active time window 31 in FIG. 3 result from the different power flow P due to the power losses that occur due to the arc 9.

The period $\Delta t_2$ of the inactive time window 32 can, as mentioned, be selected to be long enough for the input current $I_{in}$ to not be completely zero, but only reduced to such an extent that an arc 9 that may be present is reliably quenched. In one embodiment of the method according to the disclosure, in which the evaluation is carried out based solely on the input voltage $U_{in}$, the period $\Delta t_2$ of the inactive time window 32 can, however, also be selected in such a way that the input current $I_{in}$ takes on values of zero or close to zero. In that case, due to the higher values in the input voltage profile 36 and the resulting larger difference with respect to the input voltage profile 36, the possible presence of an arc can be more clearly inferred than if a shorter period $\Delta t_2$ is selected.

In one embodiment, the period $\Delta t_2$ of the inactive time window 32 can be set based on empirically determined values. In order to ensure reliable arc detection even with possible fluctuations in the power flow P, and in particular also to keep the period $\Delta t_2$ of the inactive time window 32 as short as possible, in one embodiment the period $\Delta t_2$ is set adaptively and is selected, for example, depending on detected values of a current I characterizing the power flow P and/or a voltage U characterizing the power flow P of the immediately preceding active time window 31. Alternatively, the period $\Delta t_2$ can be selected depending on the values of the input current $I_{in}$ detected in the current or one of the preceding inactive time windows 32 and/or the values of the input voltage $U_{in}$ detected in the current or one of the preceding inactive time windows 32. In one embodiment, for example, the period $\Delta t_2$ of the inactive time window 32 can be determined in that a value of the input current $I_{in}$ falls below a further current threshold value $I_{TH2}$ and a value of the input voltage $U_{in}$ exceeds a further voltage threshold value $U_{TH2}$. With adaptive setting of the period $\Delta t_2$ of the inactive time window 32, maximum and/or minimum values for the period $\Delta t_2$ can also be specified.

In one embodiment fixed, empirically determined values can be used for the further current threshold value $I_{TH2}$ and the further voltage threshold value $U_{TH2}$, with the further voltage threshold value $U_{TH2}$ selected in relation to the open circuit voltage $U_0$ of the DC source 2. A further voltage threshold $U_{TH2}$ that is variable, possibly adjusted adaptively depending on, for example, a time-varying open circuit voltage $U_0(t)$, can also be used in one embodiment. In general, the further current threshold value $I_{TH2}$ and the further voltage threshold value $U_{TH2}$ may each be selected to be greater than the current threshold value $I_{TH}$ and the voltage threshold value $U_{TH}$.

FIG. 4 shows, below one another, time profiles for operating modes BM1, BM2 of the switching circuit 10 of the circuit arrangement 1 (upper graph), as well as current I(t) (middle graph) and voltage U(t) (lower graph) of the circuit arrangement 1 from FIG. 2 during another embodiment of the method according to the disclosure. The time profiles of current and voltage each involve, for example, variables $I_{in}(t)$, $U_{in}(t)$ detected by the measuring device 4 at the input 7 of the circuit arrangement 1. In this case, the time profiles reflect the behavior of the circuit arrangement 1 in close temporal proximity to a series arc 9 that ignites at the time to. In contrast to the previously described FIG. 3, the input current profile 35 and the input voltage profile 38 in FIG. 4 are shown only schematically, in that in each case only the value of the input current $I_{in}$ or the input voltage $U_{in}$ arising after the transient processes have ended is specified.

As illustrated in the upper graph, active time windows 31 of the period $\Delta t_1$ in which the circuit arrangement 1 is in the first operating mode BM1, alternate with inactive time windows 32 of the period $\Delta t_2$ in which the circuit arrangement is in the second operating mode BM2. In the first active time window 31, the current $I_{in}$ (t) takes the value $I_1$ and the voltage $U_{in}$ (t) takes the value $U_1$. The values of the current $I_1$ and the voltage $U_1$ result from the power consumption of the DC load 3 connected to the output 8 of the circuit arrangement 1. In the immediately adjacent inactive time window 32, the power flow P between the DC source 2 and the output 8 of the circuit arrangement 1 is interrupted for the second period $\Delta t_2$. The current $I_{in}$ (t) flowing via the input 7 decreases, as explained above in connection with FIG. 3, to a value close to 0 A, while the voltage $U_{in}(t)$ applied to the input 7 increases to a value close to the open circuit voltage $U_0$ of the DC source 2. The open circuit voltage $U_0$ is usually higher than the voltage $U_1$ of the loaded DC source 2 due to the present internal resistance 2a of the real DC source 2, for example, a PV generator. In the next active time window 31, in this case the second active time window 31, the current $I_{in}(t)$ first corresponds to the value of the preceding active time window 31 up to the time to at which the arc 9 in the DC circuit 6, for example, between the DC source 2 and the input of the circuit arrangement 1, ignites. From the time $t_0$, there is a sudden slight drop in the current values, and possibly also the voltage, from the original values $I_1$, $U_1$ to the values $I_2$, $U_2$. The sudden drop in current is based on a power loss and an associated voltage drop of a series arc 9 starting from to. For example, the series arc 9 burns across a microgap in a broken conductor. In the adjoining inactive time window 32, the series arc 9 is quenched by the power flow P between the DC source 2 and the output 8 of the circuit arrangement 1 being interrupted again. The current $I_{in}$ (t) flowing via the input 7 initially falls again to a value close to 0 A, which quenches the arc and consequently the current $I_{in}$ (t) takes the value of 0 A. Although the voltage $U_{in}(t)$ applied to the input 7 in the second inactive time window 32 still increases compared to the voltage $U_2$ present in the immediately preceding second active time window 31, as explained above in connection with FIG. 3, it reaches a lower value than in the preceding first inactive time window 32. In the subsequent third active time window 31, a power flow P through the switching circuit 10 is in principle possible, but it is now prevented by the microgap, which is why the values of voltage $U_{in}$ (t) and current $I_{in}$ (t) in FIG. 3 are shown as negligibly low.

The control circuit 5 now compares the values of current $I_{in}(t)$ and/or voltage $U_{in}(t)$ of the active time window 31 detected by the measuring device 4 with the values of the respectively preceding active time window 31. When comparing the values between the second active time window 31 and the third active time window 31, in FIG. 4, the control circuit 5 determines a difference between these values that exceeds a threshold value and signals an arc presence criterion in response thereto. In response to the signaling of the arc presence criterion, possibly in conjunction with other arc presence criteria, which have been determined, for example, as described in connection with FIG. 3, the switching circuit 10 remains in the second operating mode BM2 until manual acknowledgement by a qualified person, with a power flow P between the DC source 2 and the output 8 being suppressed.

FIG. 5 shows a photovoltaic (PV) system 47 comprising a PV inverter 40 according to the disclosure in one embodiment. The PV inverter 40 is configured as a multi-string inverter comprising several (in this case as an example: two) DC-side inputs 43 comprising input terminals 43.1 and 43.2 for connecting each a PV string 45 as a DC source 2. Each of the inputs 43 is connected in parallel with a link circuit capacitance of a common DC link circuit 42 via a respective DC-DC converter 21, for example via a step-up converter. The link circuit capacitance is connected to an input of a DC-AC converter 41. The output of the DC-AC converter 41 is connected to an AC voltage (AC) grid 46 via an output 44 of the PV inverter 40 via corresponding AC isolating elements (not shown in FIG. 4).

The PV inverter 40 comprises a circuit arrangement 1 for each of the DC-side inputs 43. The circuit arrangements 1, for example, the switching circuits 10 thereof, are in this case each configured as DC-DC converters and are at least partially formed by the DC-DC converters 21 of the PV inverter 40 that are present anyway. The inputs 7 of the circuit arrangements 1 correspond here to the inputs 43 of the PV inverter 40. The outputs 8 of the circuit arrangements 1 each correspond here to the outputs of the DC-DC converter 21. The circuit arrangements 1 comprise a common control circuit 5 that is part of a central control circuit of the PV inverter 40 here and is configured to control the DC-DC converter 21 and the DC-AC converter 41. The measuring devices 4 of the circuit arrangements 1 are also part of the DC-DC converter 21 and are not explicitly illustrated in FIG. 5.

The method according to the disclosure is carried out via the control circuit 5 concurrently for each DC source 2 configured as a PV string 45. Each of the PV strings 45 therefore has a discontinuous power flow P within its respective DC lines between the PV modules and the corresponding DC-side input 43 of the PV inverter 40 during normal operation of the PV inverter 40. In this embodiment, active time windows 31 with a first period $\Delta t_1$ alternate with inactive time windows 32 with a second period $\Delta t_2$. The discontinuous power flow P within the two PV strings 45 can advantageously take place here in such a way that there is as little overlap as possible between the inactive time windows 32 of one PV string 45 and the inactive time windows of the other PV string 45, that is to say the inactive time windows are offset from each other as far as possible. If an arc 9, in particular a series arc, is now determined within one of the PV strings 45 by means of the control circuit 5, only that switching circuit 10, that is to say that DC-DC converter 21, which is assigned to that PV string 45 in which the series arc 9 was also detected is set to the second operating mode BM2 for a longer period—and possibly until a manual acknowledgement by a qualified person. In contrast, the respective other PV string 45 can continue to be operated with a discontinuous power flow P in the direction of its associated DC-side input 43.

What is claimed is:

1. A method for detecting an arc in a direct-current (DC) circuit comprising a DC load, a DC source supplying the DC load, and a circuit arrangement arranged between the DC source and the DC load, wherein the circuit arrangement comprises an input comprising two input terminals configured to connect the DC source, an output comprising two output terminals configured to connect the DC load, and a switching circuit arranged between the input and the output and comprises an input capacitance between the input terminals at the input, wherein the switching circuit is configured to enable a power flow P between the DC source and the output in a first operating mode (BM1) and to suppress the power flow P between the DC source and the output in a second operating mode (BM2), comprising:
   cyclically interrupting the power flow P between the input and the output using the switching circuit such that the power flow P is enabled in an active time window with a first period $\Delta t_1$ in the first operating mode (BM1) and the power flow P is suppressed in an inactive time window with a second period $\Delta t_2$ in the second operating mode (BM2),
   detecting an input current $I_{in}$ flowing at the input and/or an input voltage $U_{in}$ applied to the input,
   comparing values of the input current $I_{in}$ and/or input voltage $U_{in}$ detected in the inactive time window with a current threshold value $I_{TH}$ or a voltage threshold value $U_{TH}$, respectively, and
   signaling an arc presence criterion if the input current $I_{in}$ detected in the inactive time window falls below the current threshold value $I_{TH}$ and/or the input voltage $U_{in}$ detected in the inactive time window does not exceed the voltage threshold value $U_{TH}$.

2. The method as claimed in claim 1, further comprising, in response to the signaling of the arc presence criterion, interrupting the power flow P between the input and the output permanently, or at least for a period of several minutes, or until a manual acknowledgement, using the switching circuit.

3. The method as claimed in claim 1, further comprising:
   detecting a current I characterizing the power flow P and/or a voltage U characterizing the power flow P in two consecutive active time windows,
   comparing the detected values of current I and/or voltage U of the active time window with the corresponding detected values from the preceding active time window, and
   signaling a further arc presence criterion if the values of current I and/or voltage U of the active time window differ from the corresponding values of the preceding active time window by more than a threshold value.

4. The method as claimed in claim 3, further comprising, in response to the signaling of the arc presence criterion and/or the further arc presence criterion, interrupting the power flow P between the input and the output permanently, or at least for a period of several minutes, or until a manual acknowledgement, using the switching circuit.

5. The method as claimed in claim 3, wherein the active time window and the preceding active time window are separated from one another by exactly one inactive time window.

6. The method as claimed in claim 1, wherein a value of the second period $\Delta t_2$ of the inactive time window is sufficient to quench an arc that may be present in the DC circuit and to suppress reignition of the arc quenched in the inactive time window in the active time window that immediately chronologically follows the inactive time window.

7. The method as claimed in claim 6, wherein the second period $\Delta t_2$ comprises a value between 0.1 ms and 10.0 ms.

8. The method as claimed in claim 1, wherein a value of the second period $\Delta t_2$ is selected depending on detected values of a current I characterizing the power flow P and/or a voltage U characterizing the power flow P of the immediately preceding active time window, and wherein the second period $\Delta t_2$ increases as a value of the current I and/or the voltage U increases.

9. The method as claimed in claim 1, wherein the second period $\Delta t_2$ of the inactive time window is determined depending on the values of the input current $I_{in}$ detected in the inactive time window and/or on the values of the input voltage $U_{in}$ detected in the inactive time window.

10. The method as claimed in claim 9, wherein the second period $\Delta t_2$ of the inactive time window is limited in that the detected input current $I_{in}$ falls below a further current threshold value $I_{TH2}$ and/or the detected input voltage $U_{in}$ exceeds a further voltage threshold value $U_{TH2}$.

11. The method as claimed in claim 1, wherein, in the inactive time window, the input current $I_{in}$ is measured as a change over time in the input voltage $U_{in}$ applied to the input capacitance.

12. The method as claimed in claim 1, wherein the switching circuit comprises a DC-DC converter and the circuit arrangement comprises an output capacitance connected in parallel with the output, and wherein, in the active time window, a voltage $U_{out}$ applied to the output capacitance is increased toward an end of the first period $\Delta t_1$ by the switching circuit.

13. The method as claimed in claim 1, wherein a value of the first period $\Delta t_1$ of the active time window is selected such that an arc energy that would be generated by a power loss of an assumed arc in the active time window does not exceed a predetermined maximum permitted energy value $E_{max}$.

14. The method as claimed in claim 1, wherein the DC source comprises a PV string and the DC load comprises a single-phase DC-AC converter connected on an output side thereof to an AC voltage (AC) grid, and wherein the cyclical interruption of the power flow P takes place such that there is a zero crossing of an AC current $I_{AC}$ (t) flowing via an output of the DC-AC converter during the second period $\Delta t_2$ of the inactive time window.

15. The method as claimed in claim 1, wherein a plurality of DC sources are each connected to the DC load in parallel with one another via a switching circuit in order to jointly supply the DC load with their respective power flows P, wherein the method is carried out concurrently for each of the DC sources such that a temporal overlap of the inactive time windows of the plurality of DC sources is minimized.

16. A circuit arrangement for detecting an arc in a DC circuit, comprising:
- an input comprising two input terminals configured to connect a DC source and an output comprising two output terminals configured to connect a DC load,
- an input capacitance coupled between the input terminals,
- a switching circuit arranged between the input and the output, wherein the switching circuit is configured to enable a power flow P between the input and the output in a first operating mode (BM1) and to suppress a power flow P between the input and the output in a second operating mode (BM2),
- a measuring device configured to determine an input voltage $U_{in}$ applied to the input and/or an input current $I_{in}$ flowing at one of the input terminals and, if applicable, additionally for determining a voltage $U_{out}$ applied to the output and/or a current $I_{out}$ flowing at one of the output terminals, and
- a control circuit configured to control the switching circuit and optionally the measuring device,
- wherein the control circuit is configured in connection with the switching circuit and the measuring device to carry out a method, comprising:
- cyclically interrupting the power flow P between the input and the output using the switching circuit such that the power flow P is enabled in an active time window with the first period $\Delta t_1$ in the first operating mode (BM1) and the power flow P is suppressed in an inactive time window with the second period $\Delta t_2$ in the second operating mode (BM2),
- detecting an input current $I_{in}$ flowing at the input and/or an input voltage $U_{in}$ applied to the input,
- comparing values of the input current $I_{in}$ and/or input voltage $U_{in}$ detected in the inactive time window with a current threshold value $I_{TH}$ or a voltage threshold value $U_{TH}$, respectively, and
- signaling an arc presence criterion if the input current $I_{in}$ detected in the inactive time window falls below the current threshold value $I_{TH}$ and/or the input voltage $U_{in}$ detected in the inactive time window does not exceed the voltage threshold value $U_{TH}$.

17. The circuit arrangement as claimed in claim 16, wherein the switching circuit comprises a semiconductor switch arranged in one of the connection lines from one of the input terminals to one of the output terminals, wherein the semiconductor switch is free of a freewheeling diode, or wherein the semiconductor switch has an intrinsic freewheeling diode that is reverse-biased with respect to a normal current direction of the DC circuit.

18. The circuit arrangement as claimed in claim 16, wherein the circuit arrangement or the switching circuit of the circuit arrangement comprises a DC-DC converter.

19. A photovoltaic (PV) inverter, comprising:
- at least one input comprising two input terminals configured to connect a PV string as a DC source and an output for connection to an AC voltage (AC) grid,
- a DC-AC converter configured to convert a DC voltage to an AC voltage, and
- a circuit arrangement, an input of which is connected to the at least one input of the PV inverter and an output of which is connected to an input of the DC-AC converter, wherein the circuit arrangement comprises:
- the input comprising two input terminals configured to connect a DC source and the output comprising two output terminals configured to connect a DC load,
- an input capacitance coupled between the input terminals,
- a switching circuit arranged between the input and the output, wherein the switching circuit is configured to enable a power flow P between the input and the output in a first operating mode (BM1) and to suppress a power flow P between the input and the output in a second operating mode (BM2),
- a measuring device configured to determine an input voltage $U_{in}$ applied to the input and/or an input current $I_{in}$ flowing at one of the input terminals and, if applicable, additionally for determining a voltage $U_{out}$ applied to the output and/or a current $I_{out}$ flowing at one of the output terminals, and
- a control circuit configured to control the switching circuit and optionally the measuring device,
- wherein the control circuit is configured in connection with the switching circuit and the measuring device to carry out a method, comprising:
- cyclically interrupting the power flow P between the input and the output using the switching circuit such that the power flow P is enabled in an active time window with the first period $\Delta t_1$ in the first operating mode (BM1) and the power flow P is suppressed in an inactive time window with the second period $\Delta t_2$ in the second operating mode (BM2),
- detecting an input current $I_{in}$ flowing at the input and/or an input voltage $U_{in}$ applied to the input,
- comparing values of the input current $I_{in}$ and/or input voltage $U_{in}$ detected in the inactive time window with a current threshold value $I_{TH}$ or a voltage threshold value $U_{TH}$, respectively, and
- signaling an arc presence criterion if the input current $I_{in}$ detected in the inactive time window falls below the current threshold value $I_{TH}$ and/or the input voltage $U_{in}$ detected in the inactive time window does not exceed the voltage threshold value $U_{TH}$.

20. The PV inverter as claimed in claim 19, comprising a plurality of inputs for connecting a respective PV string as a DC source, wherein the inputs are each connected to a common DC link circuit in parallel with one another via a DC-DC converter each, and wherein the DC link circuit is connected to an input of the DC-AC converter, and comprise a plurality of circuit arrangements, wherein each of the inputs of the PV inverter is connected to the respective input of a circuit arrangement assigned thereto, and wherein the output of each of the circuit arrangements is connected to the respective input of the DC-AC converter.

\* \* \* \* \*